United States Patent
Detani et al.

(10) Patent No.: US 9,849,517 B2
(45) Date of Patent: Dec. 26, 2017

(54) SURFACE-COATED CUTTING TOOL AND METHOD OF MANUFACTURING THE SAME

(71) Applicant: SUMITOMO ELECTRIC HARDMETAL CORP., Itami-shi (JP)

(72) Inventors: Takanori Detani, Sorachi-gun (JP);
Shinya Imamura, Sorachi-gun (JP);
Hideaki Kanaoka, Sorachi-gun (JP);
Anongsack Paseuth, Sorachi-gun (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 0 days.

(21) Appl. No.: 15/102,992

(22) PCT Filed: Oct. 9, 2015

(86) PCT No.: PCT/JP2015/078837
§ 371 (c)(1),
(2) Date: Jun. 9, 2016

(87) PCT Pub. No.: WO2017/061059
PCT Pub. Date: Apr. 13, 2017

(65) Prior Publication Data
US 2017/0259345 A1    Sep. 14, 2017

(51) Int. Cl.
*B23B 27/14*    (2006.01)
*B23P 15/30*    (2006.01)
(Continued)

(52) U.S. Cl.
CPC ........... *B23B 27/148* (2013.01); *B23P 15/30* (2013.01); *C23C 16/303* (2013.01);
(Continued)

(58) Field of Classification Search
USPC .......... 51/307, 309; 428/212, 701, 702; 427/355, 368, 419.2
See application file for complete search history.

(56) References Cited

U.S. PATENT DOCUMENTS 7,090,914 B2 *   8/2006  Yamagata ............ C23C 30/005
                                                   51/307
8,003,234 B2 *   8/2011  Omori .................. B23B 27/141
                                                   427/419.2
(Continued)

FOREIGN PATENT DOCUMENTS

EP    1905870 A2      4/2008
JP    05-057507    *  3/1993
(Continued)

OTHER PUBLICATIONS

International Search Report in PCT International Application No. PCT/JP2015/078837, dated Dec. 15, 2015.

*Primary Examiner* — Archene Turner
(74) *Attorney, Agent, or Firm* — Venable LLP; Michael A. Sartori; Miguel A. Lopez

(57) ABSTRACT

A surface-coated cutting tool includes a base material and a coating formed on the base material. The coating includes an $\alpha$-$Al_2O_3$ layer containing a plurality of $\alpha$-$Al_2O_3$ crystal grains. The $\alpha$-$Al_2O_3$ layer includes: a first region made up of an edge ridgeline, a region A of a rake face, and a region B of a flank face; a second region which is a region of the rake face except for the region A and covered with the coating; and a third region which is a region of the flank face except for the region B. The $\alpha$-$Al_2O_3$ layer satisfies a relation $b-a>0.5$, where a is an average value of a TC(006) in the first region in texture coefficient TC(hkl) and b is an average value of the TC(006) in the second region or the third region in texture coefficient TC(hkl).

5 Claims, 1 Drawing Sheet

(51) Int. Cl.
*C23C 16/30* (2006.01)
*C23C 16/40* (2006.01)

(52) U.S. Cl.
CPC ........ *C23C 16/403* (2013.01); *B23B 2224/04* (2013.01); *B23B 2224/32* (2013.01); *B23B 2228/04* (2013.01); *B23B 2228/105* (2013.01)

(56) References Cited

U.S. PATENT DOCUMENTS

| | | | | |
|---|---|---|---|---|
| 8,187,698 | B2* | 5/2012 | Sundstrom | C23C 16/36 428/702 |
| 8,211,555 | B2* | 7/2012 | Sundstrom | C23C 16/36 428/701 |
| 2007/0104945 | A1 | 5/2007 | Ruppi | |
| 2009/0017289 | A1 | 1/2009 | Zackrisson et al. | |
| 2011/0247465 | A1 | 10/2011 | Lind et al. | |
| 2012/0015148 | A1 | 1/2012 | Ruppi | |
| 2012/0144965 | A1 | 6/2012 | Engstrom | |
| 2014/0287210 | A1 | 9/2014 | Tomita et al. | |
| 2014/0377024 | A1 | 12/2014 | Sobana et al. | |

FOREIGN PATENT DOCUMENTS

| | | | |
|---|---|---|---|
| JP | 08-011005 | * | 1/1996 |
| JP | 2007-125686 | A | 5/2007 |
| JP | 2009-028894 | A | 2/2009 |
| JP | 2012-512753 | A | 6/2012 |
| JP | 2013-063504 | A | 4/2013 |
| JP | 2013-132717 | A | 7/2013 |
| JP | 5555834 | B2 | 7/2014 |

* cited by examiner

SURFACE-COATED CUTTING TOOL AND METHOD OF MANUFACTURING THE SAME

TECHNICAL FIELD

The present invention relates to a surface-coated cutting tool and a method of manufacturing the same.

BACKGROUND ART

A surface-coated cutting tool having a coating formed on a base material has conventionally been used. For example, Japanese Patent Laying-Open No. 2013-063504 (PTD 1) proposes a surface-coated cutting tool having a coating including an upper layer in which an area ratio occupied by $Al_2O_3$ crystal grains with measured inclinations of 0 to 10° is 45 area % or more. The inclinations are inclinations of normal lines to (0001) planes, relative to a normal line to a surface of the cutting tool.

Japanese Patent Laying-Open No. 2007-125686 (PTD 2) proposes a cutting tool insert having a coating including an $\alpha$-$Al_2O_3$ layer which contains columnar $\alpha$-$Al_2O_3$ crystal grains preferably in a <001> growth direction and has a texture coefficient TC(006)>1.4.

CITATION LIST

Patent Document

PTD 1: Japanese Patent Laying-Open No. 2013-063504
PTD 2: Japanese Patent Laying-Open No. 2007-125686

SUMMARY OF INVENTION

Technical Problem

The surface-coated cutting tools proposed in above-referenced PTD 1 and PTD 2 have the effect that the strength and the thermal conductivity of the coating are improved owing to the (001) orientation of the $\alpha$-$Al_2O_3$ layer, and accordingly chemical damage which is typically crater wear can be suppressed. However, if the orientation is excessively high in a specific direction, cracks are likely to extend at grain boundaries and accordingly sudden chipping of the coating may occur.

The present invention has been made in view of the above-described circumstances, and an object of the present invention is to provide a surface-coated cutting tool which is controlled to have relatively low orientation in only the cutting edge while keeping high orientation in a certain direction across the entire tool, and in which accordingly high thermal conductivity can be maintained and sudden chipping of the cutting edge can be suppressed, and to provide a method of manufacturing the surface-coated cutting tool.

Solution to Problem

A surface-coated cutting tool according to an aspect of the present invention is a surface-coated cutting tool having a rake face, a flank face, and an edge ridgeline constituting a boundary between the rake face and the flank face. The surface-coated cutting tool includes a base material and a coating formed on the base material. The coating includes an $\alpha$-$Al_2O_3$ layer containing a plurality of $\alpha$-$Al_2O_3$ crystal grains. The $\alpha$-$Al_2O_3$ layer includes: a first region made up of the edge ridgeline, a region A of the rake face, and a region B of the flank face; a second region which is a region of the rake face except for the region A and covered with the coating; and a third region which is a region of the flank face except for the region B. The region A is sandwiched between the edge ridgeline and a virtual line in the rake face, the virtual line passing through a point located 1 mm away from the edge ridgeline and extending along the edge ridgeline. The region B is sandwiched between the edge ridgeline and a virtual line in the flank face, the virtual line passing through a point located 1 mm away from the edge ridgeline and extending along the edge ridgeline. The $\alpha$-$Al_2O_3$ layer satisfies a relation b−a>0.5, where a is an average value of a TC(006) in the first region in texture coefficient TC(hkl) and b is an average value of the TC(006) in the second region or the third region in texture coefficient TC(hkl).

Advantageous Effects of Invention

According to the foregoing, high thermal conductivity can be maintained and sudden chipping of the cutting edge can be suppressed.

DESCRIPTION OF EMBODIMENTS

Description of Embodiment of the Invention

Figure 1:
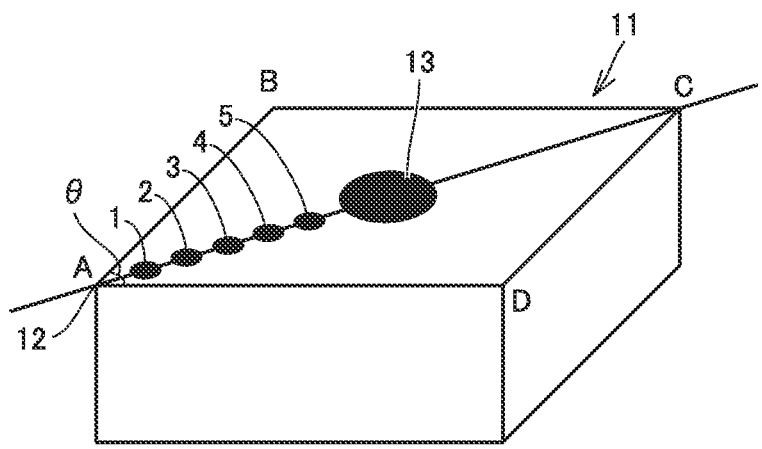
FIG. 1 is an explanatory diagram schematically showing measurement points at five locations on a surface-coated cutting tool to be irradiated with x-ray for calculating TC(hkl) by the x-ray diffraction method.

First of all, the present invention will be described based on features listed below.

[1] A surface-coated cutting tool according to an aspect of the present invention is a surface-coated cutting tool having a rake face, a flank face, and an edge ridgeline constituting a boundary between the rake face and the flank face. The surface-coated cutting tool includes a base material and a coating formed on the base material. The coating includes an $\alpha$-$Al_2O_3$ layer containing a plurality of $\alpha$-$Al_2O_3$ crystal grains. The $\alpha$-$Al_2O_3$ layer includes: a first region made up of the edge ridgeline, a region A of the rake face, and a region B of the flank face; a second region which is a region of the rake face except for the region A and covered with the coating; and a third region which is a region of the flank face except for the region B. The region A is sandwiched between the edge ridgeline and a virtual line in the rake face, the virtual line passing through a point located 1 mm away from the edge ridgeline and extending along the edge ridgeline. The region B is sandwiched between the edge ridgeline and a virtual line in the flank face, the virtual line passing through a point located 1 mm away from the edge ridgeline and extending along the edge ridgeline. The $\alpha$-$Al_2O_3$ layer satisfies a relation b−a>0.5, where a is an average value of a TC(006) in the first region in texture coefficient TC(hkl) and b is an average value of the TC(006) in the second region or the third region in texture coefficient TC(hkl). Regarding the surface-coated cutting tool having these features, sudden chipping of the cutting edge can be suppressed while high thermal conductivity is maintained.

[2] Preferably, the a satisfies a relation 0.01<a<7, and the b satisfies a relation 7<b<8. Accordingly, the high thermal conductivity can more effectively be maintained. At the same time, sudden chipping of the cutting edge can effectively be suppressed.

[3] Preferably, the $\alpha$-$Al_2O_3$ layer satisfies a relation between a and c: $0.05<c/a<1$, where c is an average value of a TC(104) in the first region in texture coefficient TC(hkl). Accordingly, particularly the effect of suppressing sudden chipping of the cutting edge can be enhanced.

[4] A method of manufacturing a surface-coated cutting tool according to an aspect of the present invention includes the steps of: forming the coating on the base material; and performing surface treatment on a portion of the coating, the portion corresponding to the first region. By the method having such features, a surface-coated cutting tool can be manufactured in which sudden chipping of the cutting edge can be suppressed while high thermal conductivity is maintained.

[5] Preferably, the surface treatment includes at least brushing or blasting. Accordingly, a surface-coated cutting tool can advantageously be manufactured in which sudden chipping of the cutting edge can be suppressed while high thermal conductivity is maintained.

Details of Embodiment of the Invention

In the following, an embodiment of the present invention (hereinafter also referred to as "present embodiment") will be described in further detail.

<Surface-Coated Cutting Tool>

A surface-coated cutting tool of the present embodiment has a rake face, a flank face, and an edge ridgeline constituting a boundary between the rake face and the flank face.

The rake face is chiefly a surface which is in contact with swarf of a workpiece during cutting. For example, in the explanatory diagram of FIG. 1, the top surface and the bottom surface of the surface-coated cutting tool are each a rake face. The flank face is chiefly a surface which faces a processed surface (a surface newly formed by cutting the workpiece). For example, in the explanatory diagram of FIG. 1, the flank face is the side surface of the surface-coated cutting tool. The edge ridgeline forms the boundary between the rake face and the flank face. In other words, the portion where the rake face and the flank face meet is the edge ridgeline. The edge ridgeline is usually a portion serving as a cutting edge (hereinafter also referred to as "edge") of the surface-coated cutting tool.

A surface-coated cutting tool of the present embodiment includes a base material and a coating formed on the base material. The coating preferably covers the entire surface of the base material. However, even the cutting tool in which a part of the base material is not covered with this coating or the makeup and structure of the coating is partially different does not go beyond the scope of the present invention.

The surface-coated cutting tool of the present embodiment can suitably be used as a cutting tool such as drill, end mill, indexable insert for the drill, indexable insert for the end mill, indexable insert for milling, indexable insert for turning, metal-slitting saw, gear-cutting tool, reamer, tap, or the like.

<Base Material>

As the base material, any base material conventionally known as a base material of this type may be used. For example, the base material is preferably any of a cemented carbide (including, for example, a WC-based cemented carbide, a cemented carbide containing WC and Co, and a cemented carbide containing WC and Co and additionally a carbonitride of Ti, Ta, Nb or the like), a cermet (having a main component such as TiC, TiN, TiCN or the like), a high-speed steel, a ceramic material (such as titanium carbide, silicon carbide, silicon nitride, aluminum nitride, aluminum oxide, or the like), cubic boron nitride sintered body, and a diamond sintered body.

Among these variety of base materials, the cemented carbide, particularly WC-based cemented carbide, or the cermet (particularly TiCN-based cermet) is preferably selected. These base materials are particularly excellent in balance between hardness and strength at high temperature, and have excellent characteristics for the base material of the surface-coated cutting tool for the above-described use.

In the case where the surface-coated cutting tool is an indexable insert or the like, the base material may have or may not have a chip breaker. Moreover, the shape of the edge ridgeline may be any of a sharp edge in a pointed shape, a honed edge (a sharp edge processed to be rounded), a negative land (beveled), a combination of the honed edge and the negative land, and the like. It should be noted that the edge ridgeline described herein refers to the edge ridgeline before shaped into a honed edge or a negative land or the like, in the case where the edge ridgeline is used as a line (no area) where the rake face and the flank face meet, for defining, for example, the range of a first region described later herein. This is for the reason that the edge ridgeline after shaped into a honed edge or a negative land or the like is not in the form of a line and the range of the first region is difficult to clearly define. Therefore, if the surface-coated cutting tool has been shaped into a honed edge or a negative land or the like, it is supposed that the edge ridgeline is a line where an extension of the rake face and an extension of the flank face meet.

<Coating>

The coating includes an $\alpha$-$Al_2O_3$ layer containing a plurality of $\alpha$-$Al_2O_3$ crystal grains. For example, the coating may be made up of a plurality of layers including at least one $\alpha$-$Al_2O_3$ layer and further including other layers.

The coating has an average thickness of 3 to 35 $\mu$m (3 $\mu$m or more and 35 $\mu$m or less, it should be noted that a numerical value range expressed with "–" or "to" herein includes the numerical values of the upper limit and the lower limit). Preferably, the coating has an average thickness of 5 to 20 $\mu$m. If this average thickness is less than 3 $\mu$m, there is a possibility that the strength of the coating is insufficient. If this average thickness is more than 35 $\mu$m, there is a possibility that the coating is peeled off or broken highly frequently when a large stress is applied between the coating and the base material during intermittent processing.

<$\alpha$-$Al_2O_3$ Layer>

The $\alpha$-$Al_2O_3$ layer contains $\alpha$-$Al_2O_3$ crystal grains as a main component. "Containing $\alpha$-$Al_2O_3$ crystal grains as a main component" means that the $\alpha$-$Al_2O_3$ crystal grains occupy 90 mass % or more of $Al_2O_3$ crystal grains constituting the $\alpha$-$Al_2O_3$ layer. Preferably, it also means that the $\alpha$-$Al_2O_3$ layer consists of the $\alpha$-$Al_2O_3$ crystal grains except for the case where crystal grains of at least one of $\beta$-$Al_2O_3$, $\gamma$-$Al_2O_3$, and $\kappa$-$Al_2O_3$ are inevitably contained.

<First Region, Second Region, and Third Region of $\alpha$-$Al_2O_3$ Layer>

The $\alpha$-$Al_2O_3$ layer includes a first region made up of the edge ridgeline, a region A of the rake face, and a region B of the flank face. The $\alpha$-$Al_2O_3$ layer further includes a second region which is a region of the rake face except for the region A and covered with the coating. The $\alpha$-$Al_2O_3$ layer also includes a third region which is a region of the flank face except for the region B. Here, the region A is sandwiched between the edge ridgeline and a virtual line in the rake face, the virtual line passing through a point located 1 mm away from the edge ridgeline and extending along the edge ridgeline. The region B is sandwiched between the edge ridgeline and a virtual line in the flank face, the virtual line passing through a point located 1 mm away from the edge ridgeline and extending along the edge ridgeline. The first region includes a point of intersection of the edge ridgelines (hereinafter referred to as "corner"), a point of intersection of the virtual lines, and a point of intersection of the edge ridgeline and the virtual line. The second region and the third region do not include the edge ridgeline.

<TC(006) in First Region and Second Region>

The $\alpha$-$Al_2O_3$ layer satisfies a relation b−a>0.5 where a is an average value of TC(006) in the first region in texture coefficient TC(hkl) and b is an average value of TC(006) in the second region in texture coefficient TC(hkl). Accordingly, the orientation is controlled so that the orientation is relatively low in only the cutting edge while high orientation in a single direction is maintained to keep the thermal conductivity high, and thereby sudden chipping of the cutting edge can be suppressed.

<TC(006) in Third Region>

The second region is formed in the rake face. In some cases, it may be difficult to measure the texture coefficient TC(hkl) due to unevenness of the rake face. In such a case as well, the $\alpha$-$Al_2O_3$ layer of the present embodiment satisfies a relation b−a>0.5, where b is an average value of TC(006) in the third region and a is an average value of TC(006) in the first region. Accordingly, the orientation is controlled so that the orientation is relatively low in only the cutting edge while high orientation in a single direction is maintained to keep the thermal conductivity high, and thereby sudden chipping of the cutting edge can be suppressed.

Texture coefficient TC(hkl) can be defined by the following expression (1).

$$TC(hkl) = \frac{I(hkl)}{I_0(hkl)} \left\{ \frac{1}{n} \sum_{1}^{n} \frac{I(hkl)}{I_0(hkl)} \right\}^{-1} \quad (1)$$

In the expression (1), I(hkl) represents an x-ray diffraction intensity of a (hkl) reflection plane, and $I_0$(hkl) represents a standard intensity according to PDF card No. 00-042-1468 of the ICDD. In the expression (1), n represents the number of reflections used for the calculation. As (hkl) reflections, (012), (104), (110), (006), (113), (024), (116), and (300) are used. Therefore, n is eight in the present embodiment.

TC(006) measured at any locations in the first region, the second region, and the third region of the $\alpha$-$Al_2O_3$ layer can be expressed by the following expression (2).

$$TC(006) = \frac{I(006)}{I_0(006)} \left\{ \frac{1}{8} \sum_{1}^{8} \frac{I(hkl)}{I_0(hkl)} \right\}^{-1} \quad (2)$$

ICDD (registered trademark) is an abbreviation for International Center of Diffraction Data. PDF (registered trademark) is an abbreviation for Power Diffraction File.

This TC(hkl) can be measured through analysis by means of an x-ray diffractometer. TC(hkl) can for example be measured by means of an x-ray diffractometer (trademark: "SmartLab (registered trademark) 3" manufactured by Rigaku Corporation) under the following conditions.

characteristic x-ray: Cu-K$\alpha$
tube voltage: 45 kV
tube current: 200 mA
x-ray diffraction method: $\theta$-$2\theta$ method
range of x-ray irradiation: A pinhole collimator is used to irradiate a range on the order of 0.3 mm in diameter with x-ray.

In the present embodiment, TC(006) is measured for example in the rake face of the surface-coated cutting tool. As long as it is measured in the rake face of the surface-coated cutting tool, a plurality of measurement points for determining the value of TC(006) can be set at any non-overlapping locations in the first region (region A), and similarly a plurality of measurement points can be set at any non-overlapping locations in the second region. Then, the measurement points are irradiated with x-ray to obtain the values of TC(006). The values of a and b which are averages of these values can thus be calculated.

If it is difficult to measure texture coefficient TC(hkl) due to unevenness of the rake face, TC(006) may be measured in the flank face of the surface-coated cutting tool. In this case as well, a plurality of measurement points for determining the values of TC(006) can be set at any non-overlapping locations in the first region (region B) of the flank face, and similarly a plurality of measurement points can be set at any non-overlapping locations in the third region. Then, the measurement points are irradiated with x-ray to obtain the values of TC(006). The values of a and b which are averages of these values can thus be obtained.

It should be noted that preferably flat locations are selected as measurement locations on the first region, the second region, and the third region, and the measurement points are two or more non-overlapping points. However, in such a case where measurement points to be set are inevitably overlapping, only one measurement point may be set. If a measurement value is apparently an abnormal value, the abnormal value may be excluded.

As shown in FIG. 1, in the present embodiment, measurement points (first measurement point 1, second measurement point 2, third measurement point 3, fourth measurement point 4, fifth measurement point 5) may be set for example at intervals of 0.75 mm from corner A (corner which is a point of intersection of two edge ridgelines) along the diagonal joining corner A and corner C each having an acute angle ($\theta$=60°) out of the four corners of the rake face. These measurement points are irradiated with x-ray under the above-described conditions to obtain x-ray diffraction (XRD) data. Based on the XRD data, the value of TC(006) can be calculated. It should be noted that a through hole 13 in FIG. 1 extends through the surface-coated cutting tool from the rake face to the opposite face (bottom face).

As described above, the first region is made up of: the edge ridge line; the region (region A) sandwiched between the edge ridgeline and a virtual line in the rake face, the virtual line passing through a point located 1 mm away from the edge ridgeline and extending along the edge ridgeline; and the region (region B) sandwiched between the edge ridgeline and a virtual line in the flank face, the virtual line passing through a point located 1 mm away from the edge ridgeline and extending along the edge ridgeline. Therefore, based on FIG. 1, first measurement point 1 and second measurement point 2 which are set at intervals of 0.75 mm from the corner along the diagonal joining corners A and C of an acute angle ($\theta$=60°) are included in the first region. The average of the values of TC(006) measured at these measurement points is the value of a. Moreover, the second region is a region of the rake face except for region A and the second region is covered with the coating. Therefore, third measurement point 3, fourth measurement point 4, and fifth measurement point 5 which are set at intervals of 0.75 mm along the aforementioned diagonal subsequently to first measurement point 1 and second measurement point 2 are included in the second region. The average of the values of TC(006) measured at these measurement points is the value of b. In the present embodiment, a value of b−a is more than 0.5. As to the upper limit of b−a, a relation b−a<8 is met, since the upper limit of TC(006) is eight based on the definition of the above expression (1).

While FIG. 1 shows an example where the measurement points are set on the diagonal extending from the corner toward the center of the surface-coated cutting tool, the measurement points are not limited to them. For example, a plurality of measurement points may be set dispersively as much as possible in each of the first region, the second region and the third region, and values of TC(006) may be measured at these measurement points.

For example, as measurement points of the first region, one or two or more measurement points may be set on an intermediate line between the edge ridgeline and a virtual line passing through a point located 1 mm away from the edge ridgeline and extending along the edge ridgeline. As measurement points of the second region, one or two or more measurement points may be set on a line located 1 mm away from the boundary between the second region and the first region toward the inside of the second region. As measurement points of the third region, one or two or more measurement points may be set on a line located 1 mm away from the boundary between the third region and the first region toward the inside of the third region. Besides, if the surface-coated cutting tool has a rake face in the shape of a regular polygon with four or more sides, the measurement points can be set on a diagonal like the present embodiment. If the surface-coated cutting tool has a circular rake face, one measurement point may be set at any location on the edge ridgeline and one or more measurement points may be set on a line passing through the center of the circle.

Average value a of TC(006) in the first region preferably satisfies a relation 0.01<a<7. Average value b of TC(006) in the second region preferably satisfies a relation 7<b<8. In the case where TC(006) is measured in the third region as well, average value b of TC(006) preferably satisfies a relation 7<b<8. In the case where these relations are satisfied, high thermal conductivity can more effectively be maintained. At the same time, sudden chipping of the cutting edge can also be suppressed more effectively.

In the case where a meets a relation a≤0.01, the orientation in a specific direction is excessively low in the first region of the α-Al$_2$O$_3$ layer and there is a possibility that desired hardness and strength of the coating cannot be maintained in the first region. In the case where a meets a relation 7≤a, the orientation in a specific direction is excessively high in the first region of the α-Al$_2$O$_3$ layer and there is a possibility that cracks are likely to extend at grain boundaries and sudden chipping may occur. In the case where b meets a relation b 7, the orientation in a specific direction is excessively low in the α-Al$_2$O$_3$ layer across the whole tool and there is a possibility that high thermal conductivity cannot be maintained. Because the upper limit of TC(006) is eight according to the definition of the above expression (1), a relation b<8 holds.

<TC(104) in First Region>

Preferably, the α-Al$_2$O$_3$ layer satisfies a relation between a and c: 0.05<c/a<1 where c is an average value of TC(104) in texture coefficient TC(hkl) in the first region.

Generally, as the angle (orientation difference) between oriented crystal planes is larger, cracks are less likely to extend and the effect of suppressing sudden chipping of the cutting edge is obtained. Meanwhile, it is known that as the angle between oriented crystal planes is larger, the thermal conductivity is decreased. Therefore, in the case where the angle formed between oriented crystal planes is approximately 45°, both the effect of suppressing chipping and the effect of maintaining thermal conductivity can be achieved in an excellent manner.

The angle between the (104) plane and the (006) plane is 45°. Therefore, in the present embodiment, the α-Al$_2$O$_3$ layer having the (006) orientation is controlled so that the α-Al$_2$O$_3$ layer also has the (014) plane orientation and the α-Al$_2$O$_3$ layer satisfies a relation 0.05<c/a<1 in the first region. In this way, the effects that extension of cracks at grain boundaries can further be suppressed and that sudden chipping of the cutting edge can more effectively be suppressed can be obtained.

TC(104) can for example be determined based on the XRD data used for determining TC(006) as described above. In the present embodiment, preferably the calculated value of c/a is more than 0.05 and less than 1.

In the case where the value of c/a meets a relation c/a≤0.05, control for making the orientation in a specific direction relatively low in the first region is insufficient, and there is a possibility that the effect of suppressing sudden chipping of the cutting edge is not adequately obtained. In the case where c/a meets a relation c/a≥1, the orientation in a specific direction in the first region is excessively low, and there is a possibility that desired hardness and strength of the coating in the first region cannot be maintained.

<Other Layers>

The coating may include other layers besides the α-Al$_2$O$_3$ layer, as described above. Examples of the other layers may be TiCNO layer, TiBN layer, TiC layer, TiN layer, TiAlN layer, TiSiN layer, AlCrN layer, TiAlSiN layer, TiAlNO layer, AlCrSiCN layer, TiCN layer, TiSiC layer, CrSiN layer, AlTiSiCO layer, TiSiCN layer, and the like. A compound expressed herein by a chemical formula like the above-referenced ones includes the compound with any of all conventionally known atomic ratios if the atomic ratio is not particularly limited, and the compound is not necessarily limited to the compound with a stoichiometric ratio.

For example, in the case of an expression "TiAlN," the ratio of the number of atoms between the elements constituting TiAlN is not limited to Ti:Al:N=0.5:0.5:1, and includes all conventionally known ratios of the number of atoms. This is applied as well to any expressions of compounds other than "TiAlN." Moreover, in the present embodiment, the metal element such as Ti, Al, Si, Zr, or Cr and the non-metal element such as N (nitrogen), O (oxygen), or C (carbon) may not necessarily constitute a stoichiometric composition.

A TiCN layer which is an example of the other layers is disposed between the α-Al$_2$O$_3$ layer and the base material. This TiCN layer is excellent in wear resistance and therefore can provide higher wear resistance to the coating. The TiCN layer is particularly preferably formed by the MT-CVD (medium temperature CVD) method. The MT-CVD method can be used to form a layer at a relatively low temperature of approximately 850 to 900° C., and can reduce damage to the base material caused by heating in the process of forming the layer.

The average thickness of the TiCN layer is preferably 5 to 15 μm. The average thickness of the TiCN layer is more preferably 7 to 12 μm. If this average thickness is less than 5 μm, there is a possibility that wear is likely to increase. If this average thickness is more than 15 μm, there is a possibility that the chipping resistance is deteriorated.

As the other layers, an outermost surface layer and an intermediate layer or the like may also be included in the coating. The outermost surface layer is a layer located at the outermost surface position in the coating. The intermediate layer is a layer disposed between the outermost surface layer and the $\alpha$-$Al_2O_3$ layer, between the $\alpha$-$Al_2O_3$ layer and the TiCN layer, or between the TiCN layer and the base material, for example. An example of the outermost surface layer may for example be a TiN layer. An example of the intermediate layer may for example be a TiCNO layer.

<Method of Manufacturing Surface-Coated Cutting Tool>

A method of manufacturing a surface-coated cutting tool of the present embodiment includes the step of forming a coating on a base material. In the present embodiment, the coating can appropriately be formed on the base material by the chemical vapor deposition (CVD) method. In the case where the CVD method is used, the deposition temperature is 800 to 1200° C. which is higher than the temperature for the physical vapor deposition method and thus the adhesion between the coating and the base material is improved. In the case where layers other than the $\alpha$-$Al_2O_3$ layer are formed as layers of the coating, these layers may be formed by a conventionally known method.

For forming the $\alpha$-$Al_2O_3$ layer, $AlCl_3$, HCl, $CO_2$, $H_2S$, $O_2$, and $H_2$ may be used as components of a raw material gas. Respective contents of the components are 0.5 to 5 vol % of $AlCl_3$, 1 to 5 vol % of HCl, 0.5 to 1 vol % of $CO_2$, 0.5 to 1 vol % of $H_2S$, and the remainder of $H_2$. Conditions of the CVD method include a temperature of 950 to 1050° C., a pressure of 1 to 10 kPa, and a gas flow rate (total gas amount) of 10 to 150 L/min.

It should be noted that the thickness of the $\alpha$-$Al_2O_3$ layer and respective thicknesses of the other layers can be adjusted by appropriately regulating the deposition time.

Moreover, the method of manufacturing a surface-coated cutting tool of the present embodiment includes the step of performing surface treatment on a portion of the coating, the portion corresponding to the first region. In particular, the surface treatment preferably includes at least brushing or blasting. Accordingly, the surface-coated cutting tool can advantageously be manufactured in which sudden chipping of the cutting edge can be suppressed while high thermal conductivity is maintained.

Figure 2:
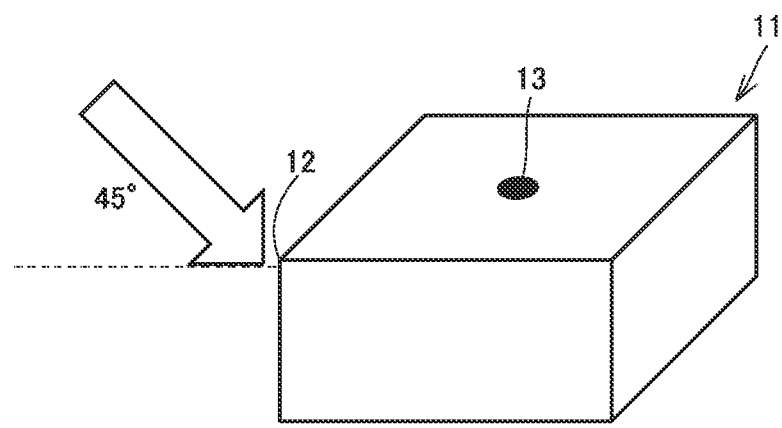
FIG. 2 is an explanatory diagram schematically showing the direction (angle) in which blast is applied to an edge ridgeline during surface treatment.

Specifically, after the coating is formed on the base material in the above-described manner, the surface treatment is performed on a portion of the coating, namely the portion corresponding to the first region. An example is now explained where blasting, for example wet blasting, is performed as the surface treatment. As shown in FIG. 2, from a leading end of a nozzle disposed at an angle of 10 to 80° (45° for example), solid fine particles having an average particle size of 25 to 100 μm (ceramic abrasive particles having an average particle size of 70 μm for example) are applied toward an edge ridgeline 12 (corner for example) of a surface-coated cutting tool 11. At the same time, surface-coated cutting tool 11 is rotated at 15 to 50 rpm about an axial center, namely a through hole 13 at the center of the rake face.

At this time, the blasting pressure may be 0.01 to 0.2 MPa (0.05 MPa for example), the blasting distance may be 2 to 20 mm (5 mm for example), the blasting time may be 5 to 10 seconds, and the concentration of the solid fine particles may be 1 to 10 vol % (the remainder is liquid in which water is a main component). Further, because rotation of surface-coated cutting tool 11 causes the distance from edge ridgeline 12 to the leading end of the nozzle to increase and decrease, it is preferable to synchronize rotation of surface-coated cutting tool 11 with movement of the nozzle position in such a manner that constantly keeps a certain distance between edge ridgeline 12 and the leading end of the nozzle.

It should be noted that brushing and various blasting treatments (sandblasting, shot peening, and the like) which have been widely known may be applied under known conditions.

Examples

In the following, the present invention will be described in further detail with reference to Examples. The present invention, however, is not limited to them.

<Preparation of Base Material>

Raw material powder with a composition: 6.5 mass % of Co, 1.2 mass % of TaC, 0.8 mass % of TiC, 1.3 mass % of NbC, and the remainder of WC was wet-mixed for eight hours with Attritor (wet-type media agitation, fine-grinding machine, trademark (model No.): "Wet-Type Attritor 100S" manufactured by Nippon Coke & Engineering Co., Ltd.) and thereafter dried. After this, the green compact was press-formed with a pressure of 100 MPa and this green compact was placed in a vacuum container and held in vacuum of 2 Pa at 1400° C. for an hour.

Next, the green compact was taken out of the vacuum container, the bottom surface was surface-polished, and thereafter edge treatment was performed. Namely, an SiC brush was used to perform honing of 0.6 mm of the rake face, to thereby prepare the base material (manufactured by Sumitomo Electric Industries, Ltd.) of WC cemented carbide with a shape of CNMA120408 defined under JIS (Japanese Industrial Standard) B 4120 (2013). The prepared base materials were grouped into three groups named Sample 1, Sample 2, and Sample 3 respectively for three different conditions of forming the $\alpha$-$Al_2O_3$ layer as will be described layer herein. Two base materials were prepared for each group.

<Formation of Coating>

On the surface of each base material obtained in the above-described manner, a coating was formed. Specifically, the base material was set in a CVD apparatus and the coating was formed on the base material by the CVD method. The conditions for forming the coating are indicated in the following Table 1, Table 2, and Table 3. Table 1 shows conditions (temperature condition, pressure condition, and thickness) for forming the $\alpha$-$Al_2O_3$ layer and each layer other than the $\alpha$-$Al_2O_3$ layer. Table 2 shows the composition of the raw material gases for forming each layer other than the $\alpha$-$Al_2O_3$ layer. Table 3 shows the composition of the raw material gas for forming the $\alpha$-$Al_2O_3$ layer. As shown in Table 1 and Table 3, there are three different gas conditions X, Y, Z for forming the $\alpha$-$Al_2O_3$ layer. Base materials to which these gas conditions were applied respectively were named Sample 1, Sample 2, and Sample 3.

It should be noted that the thickness of the α-Al₂O₃ layer and the thickness of each layer other than the α-Al₂O₃ layer can be adjusted by appropriately regulating the deposition time for forming the layer. In Table 1 and Table 2, MT-TiCN represents a TiCN layer formed by the MT-CVD method, and HT-TiCN represents a TiCN layer formed by the HT-CVD (High Temperature CVD) method. TiN (1st layer) means that the TiN layer is formed first on the base material. In the present example, the makeup of the coating is a TiN layer, an MT-TiCN layer, an HT-TiCN layer, a TiCNO layer, and an α-Al₂O₃ layer in order from the base material. In the present example, the α-Al₂O₃ layer is located at the outermost position of the coating.

TABLE 1

|  |  | common to Ti-based layers | | | | | | |
| --- | --- | --- | --- | --- | --- | --- | --- | --- |
|  |  | TiN (1st layer) | Mt-TiCN | HT-TiCN | TiCNO | α-Al₂O₃ (X) | α-Al₂O₃ (Y) | α-Al₂O₃ (Z) |
| Sample 1 | temperature (° C.) | 950 | 850 | 980 | 980 | 1000 | — | — |
|  | pressure (kPa) | 15 | 10 | 50 | 30 | 8 | — | — |
|  | thickness (μm) | 1 | 5 | 2 | 1 | 6 | — | — |
| Sample 2 | temperature (° C.) | 950 | 850 | 980 | 980 | — | 980 | — |
|  | pressure (kPa) | 15 | 10 | 50 | 30 | — | 10 | — |
|  | thickness (μm) | 1 | 5 | 2 | 1 | — | 6 | — |
| Sample 3 | temperature (° C.) | 950 | 850 | 980 | 980 | — | — | 980 |
|  | pressure (kPa) | 15 | 10 | 50 | 30 | — | — | 10 |
|  | thickness (μm) | 1 | 5 | 2 | 1 | — | — | 6 |

TABLE 2

|  | TiCl₄ | N₂ | CH₄ | C₂H₄ | CH₃CN | CO | H₂ |
| --- | --- | --- | --- | --- | --- | --- | --- |
| TiN (1st layer) | 3 | 25 | — | — | — | — | remainder |
| MT-TiCN | 3 | 20 | — | 3 | 3 | — | remainder |
| HT-TiCN | 2.5 | 20 | 5 | — | — | — | remainder |
| TiCNO | 3 | 15 | 5 | — | — | 1 | remainder | unit (vol %)

TABLE 3

|  | AlCl₃ | HCl | CO₂ | H₂S | H₂ |
| --- | --- | --- | --- | --- | --- |
| α-Al₂O₃ (X) | 0.6 | 2 | 0.6 | 0.9 | remainder |
| α-Al₂O₃ (Y) | 0.6 | 4 | 0.5 | 0.7 | remainder |
| α-Al₂O₃ (Z) | 0.6 | 4 | 0.5 | 0.25 | remainder | unit (vol %)

<Surface Treatment>

For one surface-coated cutting tool per Sample, the edge ridgeline of the surface-coated cutting tool was subjected to surface treatment. Specifically, while the surface-coated cutting tool was rotated about the axial center, namely the through hole of the rake face at a speed of 60 rpm, ceramic abrasive particles with a particle size of 70 μm were applied from a leading end of a nozzle disposed at an angle of 45° to perform wet blasting. At this time, the blasting pressure of the ceramic abrasive particles was 0.05 MPa, the blasting distance was 5 mm, the blasting time was 5 to 10 seconds, and the concentration was 5 vol % (the remainder was solvent in which water was a main component). In particular, rotation of the surface-coated cutting tool and movement of the nozzle were synchronized in such a manner that constantly kept a distance of 5 mm between the edge ridgeline and the leading end of the nozzle. In the following, the one surface-coated cutting tool subjected to surface treatment per Sample is referred to as Sample 1A, Sample 2A, Sample 3A. In this way, surface-coated cutting tools were produced corresponding to Sample 1 to Sample 3 and Sample 1A to sample 3A shown in Table 4 below.

<Measurement of TC(006) and TC(104)>

For each Sample, an x-ray diffractometer (trademark: "SmartLab (registered trademark) 3" manufactured by Rigaku Corporation) was used to obtain XRD data by the θ-2θ method by mean of Cu-KαX ray. The tube voltage was 45 kV and the tube current was 200 mA. A pinhole collimator was used for an x-ray irradiation range, and a range of 0.3 mm in diameter on the rake face was irradiated with x-ray.

Regarding each Sample, the edge ridgeline had been subjected to honing and thus the edge ridgeline in the form of a line where the rake face and the flank face met had been lost. Then, it was supposed that a line where an extension of the rake face and an extension of the flank face met was the edge ridgeline. Based on this virtual edge ridgeline, the site to be irradiated with x-ray was set. Specifically, as shown in FIG. 1, measurement points (first measurement point 1, second measurement point 2, third measurement point 3, fourth measurement point 4, fifth measurement point 5) were set at intervals of 0.75 mm from corner A along the diagonal joining corner A and corner C each having an acute angle (θ=60°, angle at the intersection of two virtual edge ridgelines). These measurement points were irradiated with x-ray under the above-described conditions. From the obtained XRD data, the value of TC(006) at each measurement point was calculated.

For each Sample, based on the XRD data obtained by means of the x-ray diffractometer, the value of TC(104) was also calculated. The results of the measurement are shown in Table 4 below.

In the present example, the first region includes a region (region A) sandwiched between the edge ridgeline and a virtual line in the rake face, the virtual line passing through a point located 1 mm away from the edge ridgeline and extending along the edge ridgeline, and therefore, first measurement point 1 and second measurement point 2 are included in the first region. The second region is a region of the rake face except for region A and covered with the coating, and therefore, third measurement point 3, fourth measurement point 4, and fifth measurement point 5 are included in the second region. Thus, the average of the values of TC(006) obtained at first measurement point 1 and second measurement point 2 is the value of a. The average of the values of TC(006) obtained at third measurement point 3, fourth measurement point 4, and fifth measurement point 5 is the value of b. The average of the values of TC(104) obtained at first measurement point 1 and second measurement point 2 is the value of c.

<Cutting Test>

For each Sample, namely cutting tool, a cutting test was conducted under the following conditions.

Workpiece: round bar of FCD250
Cutting Speed: 500 m/min
Feed: 0.2 mm/rev
Depth of Cut: 1.5 mm
Cutting Oil: wet (water-soluble oil)
Evaluation: The time (min) elapsed before fracture was measured and regarded as the life.

For the cutting test, the cutting tool was set on an NC lathe, a workpiece was cut, and the time elapsed before fracture occurred to the cutting tool was measured, the measured time was regarded as the life and evaluated. The time elapsing before occurrence of fracture is longer, the life is accordingly longer. Then, the cutting tool can be evaluated as having suppressed sudden chipping of the cutting edge. This result is also shown in Table 4 below.

The "remarks" column in Table 4 indicates change of the shape of the tool recognized through observation of each sample during and after the cutting test.

As to Sample 1A and Sample 2A, it is seen from the values of TC(006) that the $\alpha$-$Al_2O_3$ layers have the (006) orientation. Further, owing to the effect of the surface treatment, sudden chipping of the cutting edge was suppressed. As a result, an excellent life was achieved in the cutting test. Particularly as to Sample 2A, it is seen from the value of c/a that most of the $\alpha$-$Al_2O_3$ layer in the cutting edge has the (006) orientation or (104) orientation. As a result, a still more excellent life was achieved in the cutting test.

As shown in Table 4, Sample 1A and Sample 2A satisfy the relation b−a>0.5. In particular, it is seen that Sample 2A also satisfies the relation 0.05<c/a<1, and satisfies the relation 0.01<a<7 and the relation 7<b<8.

Accordingly, the surface-coated cutting tools of Sample 1A and Sample 2A are superior to the surface-coated cutting tools of Sample 1, Sample 2, Sample 3, and Sample 3A which fail to satisfy the relations b−a>0.5 and 0.05<c/a<1, in that sudden chipping of the cutting edge can be suppressed while high thermal conductivity is maintained.

TABLE 4

| | TC(006) value site of measurement | | | | | | |
|---|---|---|---|---|---|---|---|
| | 1st measurement point | 2nd measurement point | 3rd measurement point | 4th measurement point | 5th measurement point | average a | average b |
| Sample 1 | 7.82 | 7.63 | 7.76 | 7.75 | 7.7 | 7.725 | 7.736 |
| Sample 1A | 6.99 | 7.16 | 7.65 | 7.88 | 7.76 | 7.075 | 7.763 |
| Sample 2 | 7.12 | 7.22 | 7.28 | 7.31 | 7.16 | 7.17 | 7.25 |
| Sample 2A | 6.58 | 6.51 | 7.17 | 7.21 | 7.25 | 6.545 | 7.21 |
| Sample 3 | 3.54 | 3.78 | 3.63 | 3.85 | 3.5 | 3.66 | 3.66 |
| Sample 3A | 3.33 | 3.47 | 3.9 | 3.77 | 3.69 | 3.4 | 3.78 |

| | TC(104) value site of measurement | | | | | | | |
|---|---|---|---|---|---|---|---|---|
| | 1st measurement point | 2nd measurement point | 3rd measurement point | 4th measurement point | 5th measurement point | average c/a | life (min) | remarks |
| Sample 1 | 0.0782 | 0.0763 | 0.0776 | 0.0775 | 0.077 | 0.01 | 9 | chipping |
| Sample 1A | 0.2796 | 0.2148 | 0.0765 | 0.0788 | 0.0776 | 0.035 | 20 | good |
| Sample 2 | 0.1424 | 0.0722 | 0.1456 | 0.0731 | 0.0716 | 0.015 | 11 | chipping |
| Sample 2A | 0.7238 | 0.3906 | 0.2151 | 0.1442 | 0.145 | 0.085 | 25 | good |
| Sample 3 | 0.0708 | 0.0378 | 0.0363 | 0.0385 | 0.035 | 0.015 | 5 | plastic deformation |
| Sample 3A | 0.0999 | 0.0694 | 0.039 | 0.0377 | 0.0369 | 0.025 | 5 | plastic deformation |

<Test Results and Analysis>

As shown in Table 4, it is seen from the values of TC(006) that the $\alpha$-$Al_2O_3$ layers of Sample 1 and Sample 2 have the (006) orientation. However, it was found in the cutting test that these samples had a short life. Through observation of the cutting test, it was found that chipping of the cutting edge occurred in a short time, and damage widened from the site where chipping occurred. As for Sample 3 and Sample 3A, it is seen from the values of TC(006) that the $\alpha$-$Al_2O_3$ layers do not have the (006) orientation. Through observation of the cutting test, it was found that the temperature of the cutting edge was increased due to low thermal conductivity, plastic deformation occurred, and the life was short.

While the embodiment and examples of the present invention have been described above, it is originally intended that the above-described features of the embodiment and examples may be combined as appropriate or modified in various manners.

It should be construed that the embodiment disclosed herein is given by way of example in all respects, not by way of limitation. It is intended that the scope of the present invention is defined by claims, not by the above-described embodiment, and encompasses all modifications equivalent in meaning and scope to the claims.

REFERENCE SIGNS LIST

1 first measurement point; 2 second measurement point; 3 third measurement point; 4 fourth measurement point; 5 fifth measurement point; 11 surface-coated cutting tool; 12 edge ridgeline; 13 through hole

The invention claimed is:

1. A surface-coated cutting tool having a rake face, a flank face, and an edge ridgeline constituting a boundary between the rake face and the flank face, the surface-coated cutting tool comprising a base material and a coating formed on the base material, the coating including an $\alpha$-$Al_2O_3$ layer containing a plurality of $\alpha$-$Al_2O_3$ crystal grains, the $\alpha$-$Al_2O_3$ layer including:

a first region made up of the edge ridgeline, a region A of the rake face, and a region B of the flank face;

a second region which is a region of the rake face except for the region A and covered with the coating; and a third region which is a region of the flank face except for the region B, the region A being sandwiched between the edge ridgeline and a virtual line in the rake face, the virtual line passing through a point located 1 mm away from the edge ridgeline and extending along the edge ridgeline, the region B being sandwiched between the edge ridgeline and a virtual line in the flank face, the virtual line passing through a point located 1 mm away from the edge ridgeline and extending along the edge ridgeline, and the $\alpha$-$Al_2O_3$ layer satisfying a relation b−a>0.5, where a is an average value of a TC(006) in the first region in texture coefficient TC(hkl) and b is an average value of the TC(006) in the second region or the third region in texture coefficient TC(hkl).

2. The surface-coated cutting tool according to claim 1, wherein the a satisfies a relation 0.01<a<7, and the b satisfies a relation 7<b<8.

3. The surface-coated cutting tool according to claim 1, wherein the $\alpha$-$Al_2O_3$ layer satisfies a relation between a and c: 0.05<c/a<1, where c is an average value of a TC(104) in the first region in texture coefficient TC(hkl).

4. A method of manufacturing a surface-coated cutting tool as recited in claim 1, the method comprising the steps of:

forming the coating on the base material; and performing surface treatment on a portion of the coating, the portion corresponding to the first region.

5. The method of manufacturing a surface-coated cutting tool according to claim 4, wherein the surface treatment includes at least brushing or blasting.

* * * * *